(12) United States Patent
Briere

(10) Patent No.: US 9,406,674 B2
(45) Date of Patent: Aug. 2, 2016

(54) INTEGRATED III-NITRIDE D-MODE HFET WITH CASCODED PAIR HALF BRIDGE

(71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/326,333

(22) Filed: Jul. 8, 2014

(65) Prior Publication Data

US 2015/0014698 A1 Jan. 15, 2015

Related U.S. Application Data

(60) Provisional application No. 61/845,923, filed on Jul. 12, 2013.

(51) Int. Cl.
| | | |
|---|---|---|
| *H01L 27/088* | (2006.01) | |
| *H03K 17/10* | (2006.01) | |
| *H03K 17/22* | (2006.01) | |
| *H03K 17/567* | (2006.01) | |
| *H01L 27/06* | (2006.01) | |
| *H01L 25/07* | (2006.01) | |

(52) U.S. Cl.
CPC ........ *H01L 27/0883* (2013.01); *H01L 27/0605* (2013.01); *H03K 17/107* (2013.01); *H03K 17/223* (2013.01); *H03K 17/567* (2013.01); *H01L 25/074* (2013.01); *H01L 2924/0002* (2013.01); *H03K 2217/0063* (2013.01); *H03K 2217/0072* (2013.01)

(58) Field of Classification Search
CPC . H01L 25/072; H01L 25/074; H01L 27/0605; H01L 27/0883; H03K 2217/0072
See application file for complete search history.

(56) References Cited

U.S. PATENT DOCUMENTS

| | | | |
|---|---|---|---|
| 7,902,809 B2 | 3/2011 | Briere | |
| 8,017,978 B2 | 9/2011 | Lidow | |
| 8,084,783 B2 | 12/2011 | Zhang | |
| 8,847,408 B2 | 9/2014 | Lin | |
| 2004/0178849 A1* | 9/2004 | Kimura | G11C 19/184 330/253 |
| 2008/0122418 A1* | 5/2008 | Briere et al. | 323/282 |

(Continued)

FOREIGN PATENT DOCUMENTS

| | | |
|---|---|---|
| EP | 2 256 799 | 12/2010 |
| EP | 2 511 952 | 10/2012 |

(Continued)

OTHER PUBLICATIONS

U.S. Appl. No. 61/837,777, filed Jun. 21, 2013, Briere.

(Continued)

*Primary Examiner* — Tucker J Wright
(74) *Attorney, Agent, or Firm* — Farjami & Farjami LLP

(57) ABSTRACT

There are disclosed herein various implementations of a group III-V power conversion circuit including a monolithically integrated half bridge having a depletion mode III-Nitride field-effect transistor (FET), and a normally OFF composite cascoded switch including a depletion mode III-Nitride FET and an enhancement mode group IV FET. In one exemplary implementation, the monolithically integrated half bridge includes a high side depletion mode III-Nitride FET having an enable switch coupled in the conduction path of the high side depletion mode III-Nitride FET.

5 Claims, 2 Drawing Sheets

(56) References Cited

U.S. PATENT DOCUMENTS

| | | | |
|---|---|---|---|
| 2008/0136390 A1* | 6/2008 | Briere | 323/282 |
| 2009/0050939 A1 | 2/2009 | Briere | |
| 2009/0072269 A1 | 3/2009 | Suh | |
| 2010/0117095 A1* | 5/2010 | Zhang | 257/76 |
| 2010/0301396 A1* | 12/2010 | Briere | 257/195 |
| 2012/0223321 A1 | 9/2012 | Lin | |
| 2012/0256189 A1 | 10/2012 | McDonald | |
| 2012/0274366 A1 | 11/2012 | Briere | |
| 2013/0015905 A1 | 1/2013 | Briere | |
| 2013/0240898 A1 | 9/2013 | Briere | |
| 2014/0225162 A1 | 8/2014 | Briere | |
| 2014/0375242 A1 | 12/2014 | Briere | |

FOREIGN PATENT DOCUMENTS

| | | |
|---|---|---|
| JP | 2011-010487 A | 1/2011 |
| JP | 2011-101217 A | 5/2011 |

OTHER PUBLICATIONS

U.S. Appl. No. 61/845,923, filed Jul. 12, 2013, Briere.

\* cited by examiner

INTEGRATED III-NITRIDE D-MODE HFET WITH CASCODED PAIR HALF BRIDGE

The present application claims the benefit of and priority to a provisional application entitled "Group III-V and Group IV Composite Power Conversion Circuit," Ser. No. 61/845,923 filed on Jul. 12, 2013. The disclosure in this provisional application is hereby incorporated fully by reference into the present application.

BACKGROUND

I. Definition

As used herein, "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

Additionally, as used herein, the phrase "group IV FET" refers to a field-effect transistor that includes a group IV element as described above. The field-effect transistor is a transistor that uses an electric field to control the conductivity of the channel. Examples of power transistor types include a metal-oxide-semiconductor field-effect transistor (MOSFET), an insulated gate bipolar transistor (IGBT), a junction-field-effect transistor (JFET), a metal-semiconductor field-effect transistor (MESFET), super-junction field effect transistor (SJ FET) or other commonly used FETs for example.

It is also noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1200V), or higher.

II. Background Art

In high power and high performance circuit applications, group III-V field-effect transistors (FETs), such as gallium nitride (GaN) or other III-Nitride based high mobility electron transistors (HEMTs), are often desirable for their high efficiency and high-voltage operation. III-Nitride and other group III-V HEMTs operate using polarization fields to generate a two-dimensional electron gas (2DEG) allowing for high current densities with low resistive losses. Because the 2DEG can arise naturally at a heterojunction interface of the III-Nitride or other group III-V materials forming the HEMT, group III-V HEMTs typically conduct without the application of a gate potential. That is to say, III-Nitride and other group III-V HEMTs tend to be native depletion mode (D-mode) (i.e., normally ON) devices.

Although their high breakdown voltage, high current density, and low on-resistance ($R_{dson}$) render III-Nitride HEMTs advantageous for use in power applications, the normally ON nature of III-Nitride HEMTs can give rise to problems when such depletion mode transistors are used as power switches. For example, there is a possibility of damaging the load and circuit if the circuit powers up (i.e., bias is applied to the switch terminals) prior to biasing the gate of the depletion mode III-Nitride HEMT to hold it in the high resistive or off-state (OFF). One solution to this problem is to form a normally OFF cascoded composite device including a D-mode III-Nitride HEMT cascoded with a low voltage (LV) enhancement mode (E-mode) silicon (Si) metal-oxide-semiconductor FET (MOSFET). Another solution is to use an E-mode direct current (DC) enable switch (e.g., Si MOSFET, Si insulated gate bipolar transistor (IGBT)) which is implemented in the conduction path of the depletion mode III-Nitride HEMT.

When multiple III-Nitride or other group III-V HEMTs are used in otherwise conventional power conversion circuit configurations (e.g., half bridges, full bridges, multiphase bridges, and the like) simplified monolithic integration of the multiple III-Nitride or other group III-V HEMTs on a common die may be preferred as it is often easier and less expensive to monolithically integrate the group III-V devices then it would be otherwise to cingulate and package discrete group III-V devices.

SUMMARY

The present disclosure is directed to a III-Nitride half bridge circuit monolithically integrating a depletion mode III-Nitride field-effect transistor (FET), and a composite cascoded normally OFF device including a depletion mode III-Nitride FET and an enhancement mode group IV FET, substantially as shown in and/or described in connection with at least one of the figures, and as set forth more completely in the claims.

DETAILED DESCRIPTION

Figure 1:
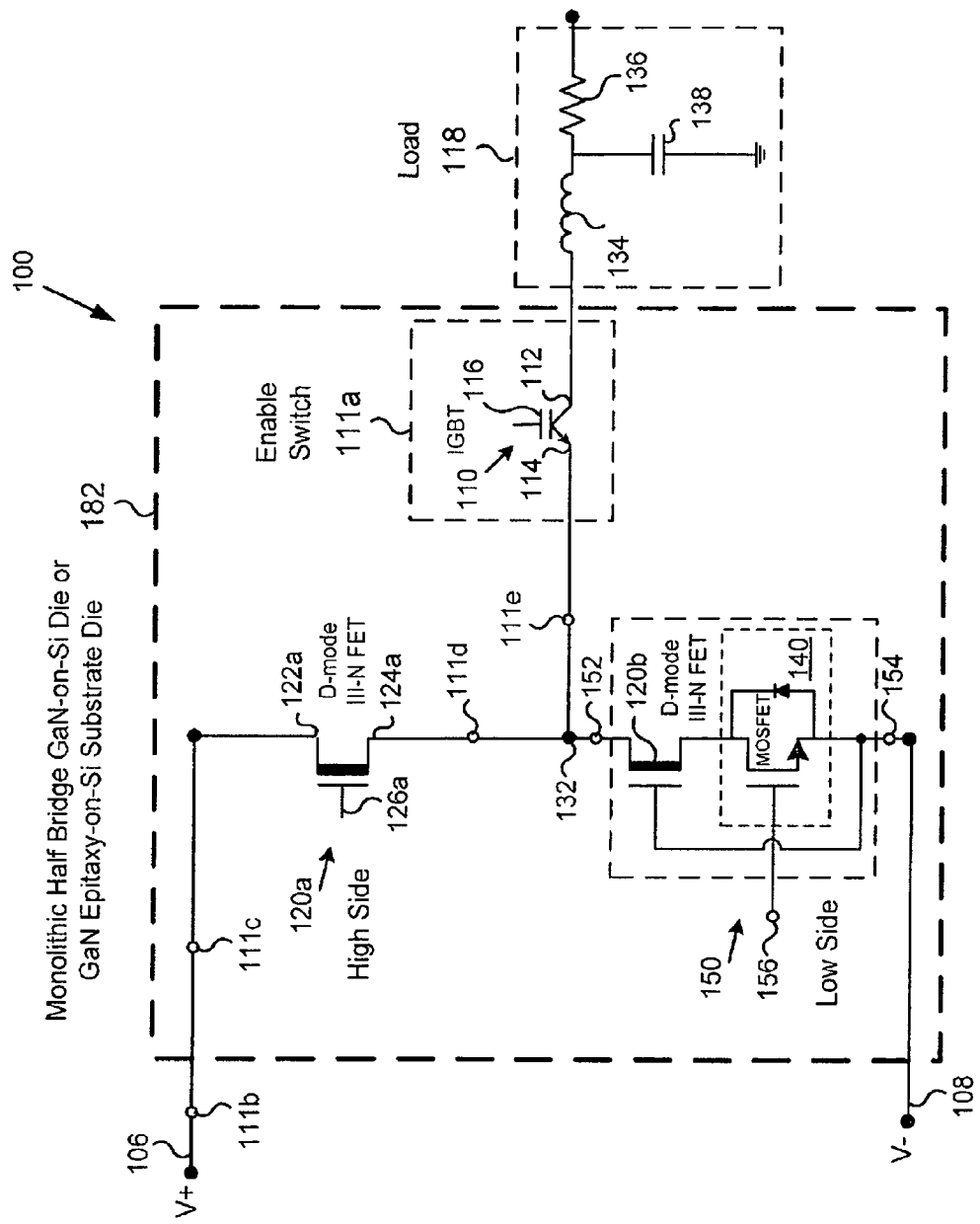
FIG. 1 shows an exemplary power conversion circuit having a monolithically integrated half bridge including a high side depletion mode III-Nitride field-effect transistor (FET) coupled to a low side composite cascaded normally OFF device including a depletion mode III-Nitride transistor cascoded with an enhancement mode metal-oxide-semiconductor FET (MOSFET), according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Power conversion circuits come in several switch configurations for use in various power management applications. Typically, silicon based metal-oxide-semiconductor field-effect transistor (MOSFET), insulated gate bipolar transistor (IGBT), and super-junction field-effect transistor (SJ FET) technologies have been used in these circuits. However, more recently, group III-V semiconductor transistor technology, such as III-Nitride high electron mobility transistor (HEMT) technology, is being developed as an alternative to these silicon based transistor devices.

As stated above, III-Nitride and other group III-V HEMTs operate using polarization fields to generate a two-dimensional electron gas (2DEG) allowing for high current densities with low resistive losses. Because the 2DEG can arise naturally at a heterojunction interface of the III-Nitride or other group III-V materials forming the HEMT, group III-V HEMTs typically conduct without the application of a gate potential. That is to say, III-Nitride and other group III-V HEMTs tend to be native depletion mode (i.e., normally ON) devices.

Although their high breakdown voltage, high current density, and low on-resistance ($R_{dson}$) render III-Nitride HEMTs advantageous for use in power applications, the normally ON nature of native III-Nitride HEMTs can give rise to problems when such depletion mode transistors are used as power switches. For example, and as stated above, there is a possibility of damaging the load and circuit if the circuit powers up (i.e., bias is applied to the switch terminals) prior to biasing the gate of at least one of the depletion mode III-Nitride HEMTs to hold it in the high resistive or off-state (OFF).

In half bridge circuit configurations there are typically two switches connected in series across the supply bus rails. In the case where native depletion mode (D-mode) devices (e.g., III-Nitride HEMTs) are used as the high and low side switches, there is a potential to short across the positive and negative rails.

One possible solution to this problem in circuits using a half bridge configuration includes the use of a normally OFF composite cascoded device including a D-mode III-Nitride HEMT cascoded with an enhancement mode (E-mode) group IV MOSFET as either the high side switch, the low side switch, or as both the high and low side switches. Examples of such composite device configurations are disclosed in U.S. Pat. No. 8,017,978, entitled "Hybrid Semiconductor Device," filed Mar. 10, 2006, and issued Sep. 13, 2011; U.S. Pat. No. 8,084,783, entitled "GaN-Based Device Cascoded with an Integrated FET/Schottky Diode Device," filed on Nov. 9, 2009, and issued Dec. 27, 2011; U.S. patent application Ser. No. 13/053,556, entitled "III-Nitride Transistor Stacked with FET in a Package," and filed on Mar. 22, 2011; U.S. patent application Ser. No. 13/434,412, entitled "Stacked Composite Device Including a Group III-V Transistor and a Group IV Vertical Transistor," and filed on Mar. 29, 2012; U.S. patent application Ser. No. 13/542,194, entitled "Nested Composite Switch," and filed on Jul. 5, 2012; U.S. patent application Ser. No. 13/780,436, entitled "Group III-V and Group IV Composite Switch," and filed on Feb. 28, 2013; and U.S. patent application Ser. No. 13/454,039, entitled "Integrated Power Stage," and filed on Apr. 23, 2012. The entire disclosures in the patents and patent applications identified above are hereby incorporated fully by reference into the present application.

Another solution for avoiding load and/or circuit damage during power up would be to use an enhancement mode direct current (DC) enable switch in the conduction path of the high side D-mode III-Nitride HEMT, the high side voltage rail, and the load. However when multiple III-Nitride HEMTs are used in otherwise conventional power conversion circuit configurations (e.g., half bridges, full bridges, multiphase bridges, and the like) simplified monolithic integration of the multiple III-Nitride HEMTs on a common die may be preferred. This may be the case, for example, because it is often easier and less expensive to monolithically integrate the III-Nitride devices then it would be otherwise to singulate and package discrete III-Nitride devices. In addition, in some implementations, it may be advantageous or desirable to monolithically integrate the enhancement mode group IV MOSFET for producing the cascoded normally OFF switch, as well as perhaps integrating the DC enable switch, if used, with the III-Nitride HEMTs.

The present application is directed to half bridge circuits including a monolithically integrated D-mode III-Nitride power switch, for example a D-mode III-Nitride heterostructure FET (HFET) such as a III-Nitride HEMT, coupled to a normally OFF composite cascoded device including a D-mode III-Nitride HEMT and an E-mode low voltage (LV) silicon or other group IV MOSFET. According to some implementations disclosed in the present application, where a D-mode III-Nitride HEMT is used as the high side switch, a DC enable switch may be implemented in the conduction path of the high side D-mode III-Nitride HEMT, the high voltage rail, and the load, in order to make or break the conduction path to or from the high side normally ON (D-mode) III-Nitride FET.

A related circuit configuration of a monolithically integrated half bridge including a normally OFF composite cascoded device for each of the high side and low side switches is disclosed in U.S. patent application Ser. No. 14/168,926, entitled "Integrated Half-Bridge Circuit with Low Side and High Side Composite Switches," and filed on Jan. 30, 2014. The entire disclosure in this patent application is hereby incorporated fully by reference into the present application.

In addition, a related circuit configuration for LV power conversion circuits and D-mode III-Nitride HEMTs using enable switches is disclosed in U.S. Pat. No. 7,902,809, entitled "DC/DC Converter Including a Depletion Mode Power Switch," filed on Nov. 27, 2007, issued on Mar. 8, 2011; while an implementation for high power conversion circuits is disclosed in U.S. patent application Ser. No. 14,302,271, entitled "Depletion Mode Group III-V Transistor with High Voltage Group IV Enable Switch," filed on Jun. 11, 2014, and which claims priority to U.S. Provisional Patent Application No. 61/837,777, entitled "Depletion Mode Group III-V Device with DC Enable IGBT Switch," filed on Jun. 21, 2013. The entire disclosures in the patent and patent applications identified above are hereby incorporated fully by reference into the present application.

Referring now to FIG. 1, FIG. 1 shows exemplary power conversion circuit 100 including monolithic half bridge circuit die 182. In addition to monolithic half bridge circuit die 182, power conversion circuit 100 further includes high voltage rail 106, low voltage rail 108, optional enable switch 111a, and load 118.

Monolithic half bridge circuit die 182 includes a low side switch and a high side switch coupled by switch node 132. According to the implementation shown in FIG. 1, the low side switch takes the form of low side normally OFF composite switch 150 coupled to low voltage rail 108, and the high side switch takes the form of D-mode III-Nitride FET 120a coupled to high voltage rail 106. As noted above and shown in FIG. 1, low side composite switch 150 is coupled to high side D-mode III-Nitride FET 120a to provide switch node 132.

As shown in FIG. 1, high side D-mode III-Nitride FET 120a has drain 122a, source 124a, and gate 126a. As further shown in FIG. 1, low side composite switch 150 includes D-mode III-Nitride FET 120b cascoded with group IV MOSFET 140, which is implemented as an E-mode (normally OFF) transistor. Low side composite switch 150 includes composite drain 152 provided by D-mode III-Nitride FET 120b, as well as composite source 154 and composite gate 156 provided by group IV MOSFET 140. It is noted that in various implementations, D-Mode III-Nitride FETs 120a and 120b may take the form of III-Nitride or other group III-V HFETs, such as HEMTs.

Also shown in FIG. 1 is load 118 coupled to switch node 132 through output inductor 134, and capacitor 138. Load 118 may be predominantly resistive, as shown by load resistance 136, predominantly inductive or capacitive, or may be a combination of inductance, resistance and capacitance.

It is further noted that power conversion circuit 100 includes optional enable switch 111a. According to the implementation shown in FIG. 1, enable switch 111a may include enhancement mode silicon or other group IV IGBT 110 coupled between switch node 132 and load 118. IGBT 110 has collector 112, emitter 114, and gate 116. As discussed above, enable switch 111a is coupled in the conduction path of high side switch 120a, high side rail 106, and load 118, to prevent shorting across the positive and negative supply buses represented by high voltage rail 106 and low voltage rail 108. According to the implementation shown in FIG. 1, enable switch 111a is kept in the off-state until D-mode III-Nitride FET 120a is controlled in a switch mode (e.g., is OFF due to the supplying of a negative bias to the gate of the normally ON device) for any extended period of time (except for some short period of time well known in the art as shoot-through) and the system controller (not shown in FIG. 1) determines the system is safe (e.g., no short or other undesirable condition exists at load 118).

Although enable switch 111a is shown in FIG. 1 as IGBT 110, enable switch 111a may be implemented as a group IV MOSFET or other E-mode group IV based device technology. It is also noted that power conversion circuit 100 may include additional features omitted from FIG. 1 for conceptual clarity. For example, power conversion circuit 100 typically includes driver circuitry for driving gate 126a of high side D-mode III-Nitride FET 120a and composite gate 156 of low side composite switch 150, as well as a voltage source selectably coupled to gate 116 of IGBT 110 to turn enable switch 111a ON and OFF.

FIG. 1 provides an example of utilizing monolithic half bridge circuit die 182 including high side D-mode III-Nitride FET 120a coupled to the low side switch of power conversion circuit 100 implemented as composite switch 150. Power conversion circuit 100 may be configured as a boost converter, a buck converter, a motor drive, or various other voltage converter circuit configurations utilized in the art.

According to the exemplary implementation shown in FIG. 1, enable switch 111a is configured so as to be coupled between switch node 132 of monolithic half bridge circuit die 182 and load 118. However, in other implementations, enable switch 111a may be coupled in the conduction path between high voltage rail 106, high side D-mode III-Nitride FET 120a, and load 118 by coupling enable switch 111a anywhere along the conduction path connecting those circuit elements, such as any of locations 111b, 111c, 111d, or 111e shown in FIG. 1. For example, enable switch 111a may be coupled on the monolithic half bridge die 182 between source 124a of high side D-mode III-Nitride FET 120a and switch node 132, as shown in FIG. 1 as location 111d, or may be coupled on the monolithic half bridge die 182 between switch node 132 and load 118. In some implementations, enable switch 111a may be coupled on the monolithic half bridge die 182 between high voltage rail 106 and drain 122a of high side D-mode III-Nitride FET 120a at location 111c, or enable switch 111a may be coupled between high voltage rail 106 and drain 122a of high side D-mode III-Nitride FET 120a at location 111b, which is not on the monolithic half bridge die 182.

Figure 2:
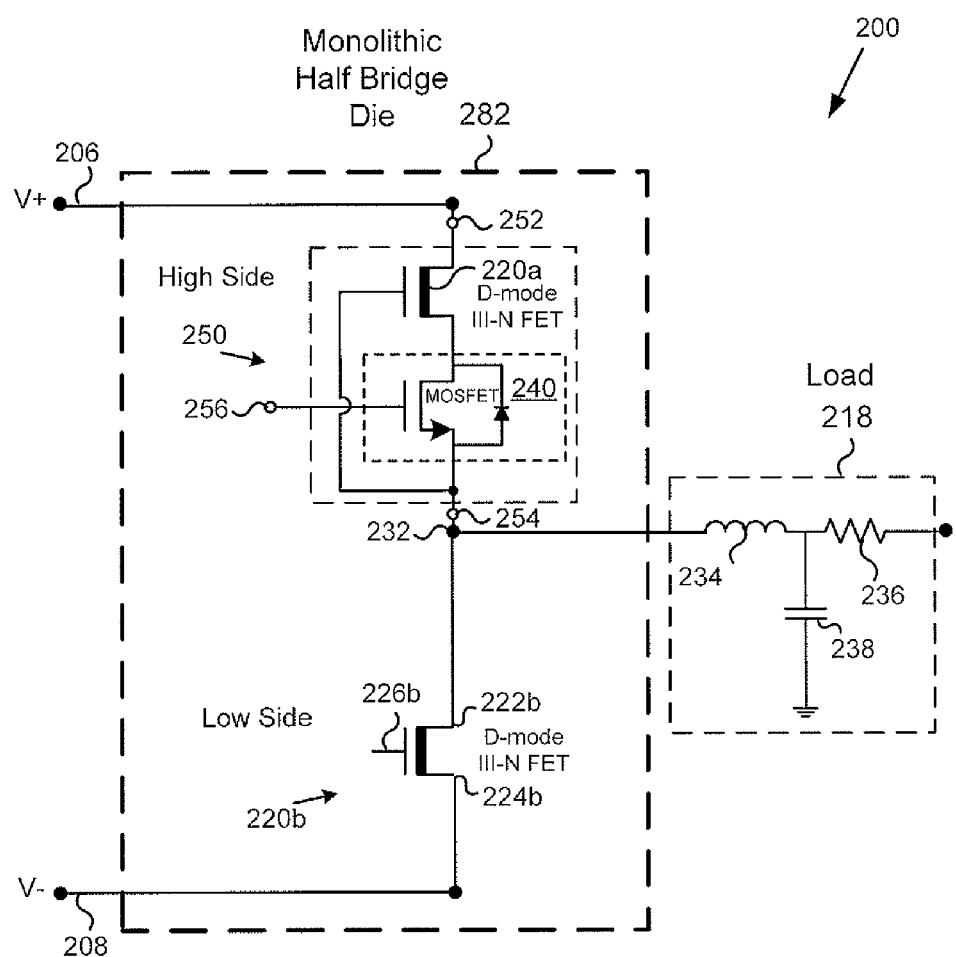
FIG. 2 shows an exemplary power conversion circuit having a monolithically integrated half bridge including a high side composite cascaded normally OFF device including a depletion mode III-Nitride FET cascoded with an enhancement mode MOSFET, and a low side depletion mode group III-Nitride FET coupled to the high side composite cascoded normally OFF device, according to one implementation.

Turning to FIG. 2, FIG. 2 shows exemplary power conversion circuit 200 having a high side composite switch, including a D-mode III-Nitride FET cascoded with an E-mode silicon or other group IV based MOSFET, and a low side D-mode III-Nitride FET according to one implementation. Power conversion circuit 200, which may be configured as a buck converter circuit, for example, includes monolithic half bridge circuit die 282 including high side composite switch 250 and low side D-mode III-Nitride FET 220b. As shown in FIG. 2, low side D-mode III-Nitride FET 220b is coupled between switch node 232 and low voltage rail 208 of power conversion circuit 200. As further shown in FIG. 2, high side composite switch 250 is coupled to high voltage rail 206 of power conversion circuit 200, as well as being coupled to low side D-mode III-Nitride FET 220b at switch node 232.

High side composite switch 250 includes D-mode III-Nitride FET 220a cascoded with group IV MOSFET 240. High side composite switch 250 includes composite drain 252 provided by D-mode III-Nitride FET 220a, as well as composite source 254 and composite gate 256 provided by group IV MOSFET 240. Also shown in FIG. 2 are source 222b, drain 224b, and gate 226b of low side D-mode III-Nitride FET 220b, as well as load 218 coupled to switch node 232 through output inductor 234, and capacitor 238. Load 218 may be predominantly resistive, as shown by load resistance 236, predominantly inductive or capacitive, or may be a combination of inductance, resistance and capacitance. It is noted that in various implementations, D-Mode III-Nitride FETs 220a and 220b may take the form of III-Nitride or other group III-V HFETs, such as HEMTs.

It is further noted that in the implementation shown in FIG. 2 where a normally OFF composite cascoded device is used for the high side switch, and the low side switch is implemented as a D-mode III-Nitride FET, there is no need for an enable switch to protect the load from high voltage rail 206, because high side composite switch 250 is normally OFF. As a result, there will typically not be any short to ground or to the load during power up of the circuitry.

It is also noted that power conversion circuit 200 may include additional features omitted from FIG. 2 for conceptual clarity. For example, power conversion circuit 200 typically includes driver circuitry for driving composite gate 256 of high side composite switch 250 and gate 226*b* of low side D-mode III-Nitride FET 220*b*.

In some implementations, it may be advantageous or desirable to monolithically integrate the half bridge circuit shown in FIGS. 1/2 on a single gallium nitride (GaN)-on-silicon based chip or die, such as a GaN epitaxy-on-silicon substrate die, for example. In other words, D-mode III-Nitride FETs 120*a*/220*a* and 120*b*/220*b* can be monolithically integrated on half bridge circuit die 182/282. Such monolithic integration may be performed so that composite switch 150/250 can be further integrated into a cascoded configuration in which D-mode III-Nitride FET 120*b*/220*a* is integrated with group IV MOSFET 140/240 through die stacking of the die of group IV MOSFET 140/240 onto the source of D-mode III-Nitride FET 120*b*/220*a*. In other words, E-mode group IV MOSFET 140/240 may be die-stacked on top of D-mode III-Nitride FET 120*b*/220*a*. Furthermore, in some implementations, D-mode III-Nitride FET 120*b*/220*a* may be die-stacked on top of E-mode group IV MOSFET 140/240.

Alternatively, group IV MOSFET 140/240 can be integrated into a silicon substrate serving as a support substrate for fabrication of D-mode III-Nitride FET 120*a*/220*a* and D-mode III-Nitride FET 120*b*/220*b*. Moreover, in some implementations, it may be advantageous or desirable to integrate D-mode III-Nitride FET 120*b*/220*a* and group IV MOSFET 140/240 of composite switch 150/250 using through via interconnects as disclosed, for example, by U.S. patent application Ser. No. 12/174,329, entitled "III-Nitride Device," filed on Jul. 16, 2008, and published as U.S. Patent Application Publication No. 2009/0050939 A1 on Feb. 26, 2009. The entire disclosure in this patent application is hereby incorporated fully by reference into the present application.

In other implementations, referring for example to FIG. 1, enable switch 111*a* may be integrated through die stacking of the die of enable switch 111*a* onto the monolithic half bridge circuit die 182 at locations 111*c*, 111*d* or 111*e* of the half bridge circuit.

Thus, the present application discloses various implementations of group III-V power conversion circuits including monolithic integration of a D-mode III-Nitride FET and a normally OFF composite switch including a D-mode III-Nitride FET and a silicon or other group IV MOSFET. In some implementations, for example when the high side switch is the D-mode III-Nitride FET, a DC enable switch is situated in the conduction path of the high side D-mode group III-Nitride FET, in order to make or break the conduction path to or from the high side D-mode III-Nitride FET. In other implementations, the DC enable switch can be integrated by die stacking onto the monolithically integrated half bridge circuit die.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. An integrated half bridge circuit including a high side switch and a low side switch, said integrated half bridge circuit comprising:
a die including first and second depletion mode III-Nitride field-effect transistors (FETs) integrated thereon;
a group IV enhancement mode FET;
said group IV enhancement mode FET cascoded with said second depletion mode III-Nitride FET to provide a normally OFF composite cascoded switch as said low side switch;
a group IV enhancement mode insulated gate bipolar transistor (IGBT) enable switch being in a conduction path of said high side switch, said group IV enhancement mode IGBT enable switch having an emitter coupled to a switch node of said integrated half bridge circuit and a collector coupled to a load;
said group IV enhancement mode IGBT enable switch being configured to prevent shorting across a high voltage rail and a low voltage rail.

2. The integrated half bridge circuit of claim 1, wherein said first and second depletion mode III-Nitride FETs comprise respective first and second III-Nitride High Electron Mobility Transistors (HEMTs).

3. The integrated half bridge circuit of claim 1, wherein said group IV enhancement mode FET is integrated with said second depletion mode III-Nitride FET.

4. The integrated half bridge circuit of claim 1, wherein said group IV enhancement mode IGBT enable switch is integrated with said half bridge circuit.

5. The integrated half bridge circuit of claim 1, wherein said integration is based on a single gallium nitride (GaN) epitaxy-on-silicon substrate die.

\* \* \* \* \*